(12) United States Patent
Barnes

(10) Patent No.: US 11,495,414 B2
(45) Date of Patent: Nov. 8, 2022

(54) SOLAR CELL SYSTEMS AND METHODS OF MAKING THE SAME

(71) Applicant: Taka Solar Corporation, Mountain View, CA (US)

(72) Inventor: Christopher Dwight Barnes, Mountain View, CA (US)

(73) Assignee: Taka Solar Corporation, Mountain View, CA (US)

( * ) Notice: Subject to any disclaimer, the term of this patent is extended or adjusted under 35 U.S.C. 154(b) by 0 days.

(21) Appl. No.: 17/357,390

(22) Filed: Jun. 24, 2021

(65) Prior Publication Data

US 2021/0408316 A1   Dec. 30, 2021

Related U.S. Application Data

(60) Provisional application No. 63/061,728, filed on Aug. 5, 2020, provisional application No. 63/044,967, filed on Jun. 26, 2020.

(51) Int. Cl.
*H01G 9/20* (2006.01)
*H01L 51/44* (2006.01)
(Continued)

(52) U.S. Cl.
CPC ......... *H01G 9/2077* (2013.01); *H01G 9/2009* (2013.01); *H01G 9/209* (2013.01);
(Continued)

(58) Field of Classification Search
CPC .. H01G 9/2095; H01G 9/2009; H01G 9/2077; H01G 9/209; H01L 31/02013;
(Continued)

(56) References Cited

U.S. PATENT DOCUMENTS 9,812,590 B2 * 11/2017 Kim ................... H01L 31/0547
10,920,482 B2 * 2/2021 Umeda ................. H01L 31/054
(Continued)

FOREIGN PATENT DOCUMENTS

DE          19752678 A1 *  6/1999  ........... H01L 31/048
DE      102018201200 A1 *  8/2019  ............. H02S 40/00
(Continued)

OTHER PUBLICATIONS

International Search Report and Written Opinion for International Patent Application No. PCT/US2021/038922 dated Dec. 1, 2021; 14 pages.
(Continued)

*Primary Examiner* — Golam Mowla
(74) *Attorney, Agent, or Firm* — Run8 Patent Group, LLC; Peter Miller; Alexander Rodriguez

(57) ABSTRACT

A solar cell system and a flexible solar panel are disclosed herein. The solar cell system includes a glass housing, a set of rows of solar cells each defining a front side and a rear side and arranged within the glass housing. The solar cell system can also include a reflective element disposed in the glass housing and facing the rear side of the set of rows of solar cells and a first terminal coupled to a first end of the set of rows of solar cells, traversing through and sealed against the first end of the glass housing. The solar cell system can be configured with other solar cell systems into the flexible solar panel that is deployable in a wide range of potential applications.

10 Claims, 5 Drawing Sheets

(51) Int. Cl.
  *H01L 51/42* (2006.01)
  *H01L 31/056* (2014.01)
  *H01L 31/048* (2014.01)
  *H01L 31/068* (2012.01)
  *H01L 31/02* (2006.01)
  *H01L 51/00* (2006.01)

(52) U.S. Cl.
  CPC ......... *H01G 9/2095* (2013.01); *H01L 31/048* (2013.01); *H01L 31/056* (2014.12); *H01L 31/0684* (2013.01); *H01L 51/0097* (2013.01); *H01L 51/4253* (2013.01); *H01L 51/447* (2013.01); *H01L 51/448* (2013.01); *H01L 31/02008* (2013.01)

(58) Field of Classification Search
  CPC ............ H01L 31/02008; H01L 31/048; H01L 31/0684; H01L 31/056; H01L 51/448; H01L 51/4253; H01L 51/447
  See application file for complete search history.

(56) References Cited

U.S. PATENT DOCUMENTS

| | | | |
|---|---|---|---|
| 10,978,994 B2 | 4/2021 | Petrova-Koch et al. | |
| 2007/0079864 A1* | 4/2007 | Gronet | H01L 31/042 136/244 |
| 2007/0157964 A1* | 7/2007 | Gronet | H01L 31/03923 257/E31.038 |
| 2008/0078444 A1 | 4/2008 | Atanackovic | |
| 2010/0018568 A1 | 1/2010 | Nakata | |
| 2011/0232721 A1 | 9/2011 | Raymond et al. | |
| 2012/0097213 A1* | 4/2012 | Weidner | H01L 31/0547 136/246 |
| 2012/0103387 A1* | 5/2012 | Fischer | H01L 31/049 257/E51.012 |
| 2014/0034114 A1 | 2/2014 | Wares | |
| 2015/0243446 A1 | 8/2015 | Goldstein et al. | |
| 2016/0013329 A1* | 1/2016 | Brophy | C03C 17/007 136/256 |
| 2018/0019358 A1 | 1/2018 | Ahn | |
| 2022/0181509 A1* | 6/2022 | Hahn | H01L 31/056 |

FOREIGN PATENT DOCUMENTS

| | | | | |
|---|---|---|---|---|
| EP | 3136016 A1 * | 3/2017 | ............ | F24S 20/25 |
| WO | WO-2011008240 A2 * | 1/2011 | ......... | H01L 31/0488 |
| WO | WO-2018056286 A1 * | 3/2018 | ............ | E06B 3/66 |
| WO | WO-2019092458 A1 * | 5/2019 | ............ | E06B 9/24 |

OTHER PUBLICATIONS

Notification of the International Application No. and of the International Filing Date for International Patent Application No. PCT/US2021/038922 dated Jul. 15, 2021; 1 page.

* cited by examiner

SOLAR CELL SYSTEMS AND METHODS OF MAKING THE SAME

CROSS-REFERENCE TO RELATED APPLICATIONS

This application claims the benefit of U.S. Provisional Application No. 63/044,967 filed on 26 Jun. 2020 and entitled "System and Method for Packaging Solar Cells," which is incorporated in its entirety by this reference. This application claims the benefit of U.S. Provisional Application No. 63/061,728 filed on 5 Aug. 2020 and entitled "Flexible Solar Panel," which is incorporated in its entirety by this reference.

TECHNICAL FIELD

This invention relates generally to the field of solar power systems and more specifically to new and useful systems and methods for packaging and deploying solar cells in the field of solar power systems.

DESCRIPTION OF THE EMBODIMENTS

Figure 1:
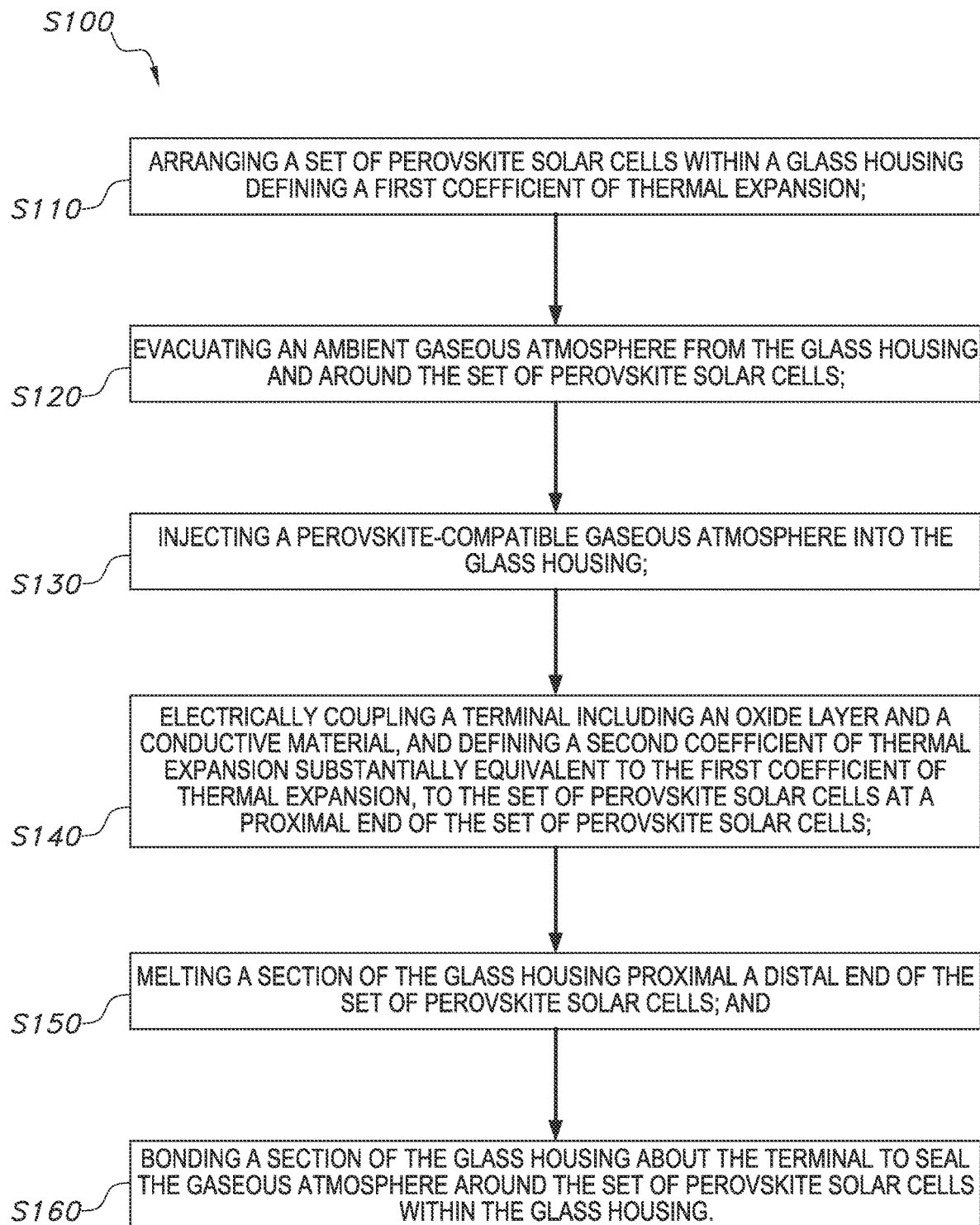
FIG. 1 is a flowchart representation of a first method.

The following description of embodiments of the invention is not intended to limit the invention to these embodiments but rather to enable a person skilled in the art to make and use this invention. Variations, configurations, implementations, example implementations, and examples described herein are optional and are not exclusive to the variations, configurations, implementations, example implementations, and examples they describe. The invention described herein can include any and all permutations of these variations, configurations, implementations, example implementations, and examples.

1. Method

A method S100 for packaging solar cells includes: arranging a set of perovskite solar cells within a glass housing defining a first coefficient of thermal expansion in Block S110; evacuating an ambient gaseous atmosphere from the glass housing and around the set of perovskite solar cells in Block S120; electrically coupling a terminal including an oxide layer and a conductive material, and defining a second coefficient of thermal expansion substantially equivalent to the first coefficient of thermal expansion, to the set of perovskite solar cells at a proximal end of the set of perovskite solar cells in Block S140. The method S100 can further include bonding a section of the glass housing about the terminal to seal the gaseous atmosphere around the set of perovskite solar cells within the glass housing in Block S160.

In variations of the example implementation described below, the method S100 can further include injecting a perovskite-compatible gaseous atmosphere into the glass housing in Block S130 and melting a section of the glass housing proximal a distal end of the set of perovskite solar cells in Block S150.

2. Solar Cell System

A solar cell system 100 includes: a glass housing 102 defining a cross section, a first end 104, and a second end 106 opposite the first end 104. The solar cell system 100 can further include a set of rows of solar cells 102 each defining a front side 120A and a rear side 120B and arranged within the glass housing 102. The set of rows of solar cells 120 can include a first row of solar cells 122 and a second row of solar cells 124 positionally offset from the first row of solar cells 122 across the cross section of the glass housing 102. The solar cell system 100 can also include a reflective element 130 disposed in the glass housing 102 and facing the rear side 120B of the set of rows of solar cells 120 and a first terminal 140 coupled to a first end of the set of rows of solar cells 120, traversing through and sealed against the first end 104 of the glass housing 102.

Variations of the exemplary solar system 100 can include a glass housing 102 defining a first end 104, a second end 106 opposite the first end 104, and a circular cross section defining a first diameter 108 and a second diameter 110 perpendicular to the first diameter 108. The solar system 100 can also include: a set of rows of bifacial perovskite solar cells 120 including a first row of bifacial perovskite solar cells 122 arranged within a first volume of the glass housing 102 defined on a first side of the first diameter 108 and on a first side of the second diameter 110, defining a first front side 122A facing outwardly from a center of the glass housing 102 and defining a first rear side 122B facing inwardly toward the center of the glass housing 102; and a second row of bifacial perovskite solar cells 124 arranged within a second volume of the glass housing 102 defined on a first side of the first diameter 108 and on the second side of the second diameter 110, defining a second front side 124A facing outwardly from the center of the glass housing 102 and defining a second rear side 124B facing inwardly toward the center of the glass housing 102. The solar cell system 100 can also include a reflective element 130 disposed on an interior surface of the glass housing 102 on a second side of the first diameter 108; and reflecting incident light toward the first rear side 122B of the first row of bifacial perovskite solar cells 122 and toward the second rear side 122B of the second row of bifacial perovskite solar cells 124. The solar cell system 100 can also include a first terminal 140 coupled to the set of rows of bifacial perovskite solar cells 120 traversing through the first end 104 of the glass housing 102 and sealed against the first end 104 of the glass housing 102; and a second terminal 150 coupled to the set of rows of bifacial perovskite solar cells 120, traversing through the second end 106 of the glass housing 102, and sealed against the second end 106 of the glass housing 102. The solar cell system 100 can further include a perovskite-compatible gaseous atmosphere 160 sealed within the glass housing 102.

In other variations of the example implantation, the set of solar cells 120 can be arranged on both sides of the first diameter 110. For example, the set of solar cells 120 can be arranged such that they form two substantially planar surfaces that are angularly offset from one another about the second diameter 112. In this particular variation, when viewed along a cross-section the sets of solar cells 120 would be arranged in an A-frame or V-shaped geometry. Alternatively, additional sets of solar cells 120 can be arranged about the inner surface of the glass housing 102 such that, when viewed cross-sectionally, the sets of solar cells 120 would be arranged in a triangular, square, rectangular, pentagonal, hexagonal, or other polygonal shape. In yet another alternative, the sets of solar cells 120 can be formed as a unitary tubular structure, either inserted into the glass housing 102 or deposited/grown therein to provide a continuous three hundred sixty degrees of exposed surface as viewed along the cross section of the glass housing 102.

3. Flexible Solar Panel System

A flexible solar panel system 200 can include a set of solar cell modules 100, each including: an elongate glass housing 102 defining a cross section, a first end 104, and a second end 106 opposite the first end 104; a first cap 202 hermetically connected at the first end 104 of the elongate sealed glass housing 102; and a second cap 204 disposed at the second end 106 of the sealed glass housing 102. Each of the solar cell modules 100 can also include a set of solar cells 120 each defining a front side 120A and a rear side 120B and arranged within the elongate glass housing 102, a reflective element 130 disposed in the elongate glass housing 102 positionally offset from the set of solar cells 120 and facing the rear side 120B of the set of rows of solar cells 120, and an electrical harness or terminal to electrically couple each of the set of solar cell modules 120. The flexible solar panel system 200 can also include a first cable 212 connected to the first cap 202 at the first end 104 of each of the set of solar cell modules 100 and a first set of fiducials 222 configured to position the first cap 202 and the first end 104 of each of the solar cell modules 100 at a predetermined distance along the first cable 212. The flexible solar panel system 200 can further include a second cable 214 connected to the second cap 204 at the second end 106 of each of the set of solar cell modules 100 and a second set of fiducials 224 configured to position the second cap 204 and the second end 106 of each of the set of solar cell modules 100 at a second predetermined distance along the second cable 214 such that each of the solar cell modules 100 is fixedly arranged substantially perpendicular to the first and second cables 212, 214.

4. Applications

Generally, the method S100, solar cell system 100, and flexible solar panel system 200 described below are directed to efficiency improvements in the manufacture, distribution, and use of solar power systems.

4.1 Solar Cell Modules

Generally, the method S100 can be executed to manufacture a sealed, modular solar cell system 100 that houses a set of solar cells within a hermetically sealed environment (e.g., a vacuum, an inert gas, a gas environment complementary to a solar cell chemistry) in order to protect and/or preserve these solar cells throughout the operational lifespan of the solar cell system 100. For example, the method S100 can be executed to assemble a unit of the solar cell system 100 housing solar cells of unstable cell chemistries—such as perovskite solar cells, tandem perovskite-silicon cells, silicon-based solar cells, or organic solar cells—within a controlled, hermetically-sealed environment that inhibits cell degradation, thereby prolonging operational lifespan of these solar cell systems 100 when deployed for solar energy harvesting in a variety of environmental conditions (e.g., floating on a body of water; installed over an agricultural field, installed on a roof or vertical wall).

In particular, Blocks of the method S100 can be executed to seal and/or bond the end(s) of an evacuated, rigid glass housing around a pair of electrodes that are electrically coupled to a set of solar cells (e.g., perovskite or crystalline silicon solar cells) arranged within the glass housing, thereby sealing the set of perovskite solar cells under vacuum conditions (e.g., $10^{-3}$ Torr) while enabling power converted by these solar cells to be routed to external traces and/or power lines connected to the exterior of the glass housing. Moreover, the glass housing 102 can be backfilled with: an atmosphere of inert gas (e.g., nitrogen gas) a gaseous atmosphere analogous to the cell chemistry of the solar cell during manufacture of the solar cell system 100 in order to reduce and/or arrest degradation of the solar cell over time.

As shown in the FIGURES, for a solar cell system 100 assembled with a set of perovskite solar cells and sealed according to Blocks of the method S100, these perovskite solar cells may be maintained and operated in a hermetically-sealed environment that is impermeable to intrusions of humidity, water, and oxygen from the external environment and that confines these perovskite solar cells within a vacuum or complementary gas atmosphere, thereby stabilizing the perovskite material and maintaining power conversion efficiency of the perovskite solar cells over extended timescales (e.g., years, decades). Furthermore, in this example, the solar cell system 100 can seal trace amounts of lead and potentially toxic compounds present in some perovskite solar cells within the glass housing over the operational lifespan of the solar cell system 100, thereby reducing environmental impact of a solar deployment containing perovskite solar cells, such as to residential or commercial areas, agricultural fields, or bodies of water, etc.

Furthermore, in the foregoing example, the glass housing can form a rigid, durable, transparent housing, and these perovskite solar cells can be sprung against, kinematically coupled to, or otherwise flexibly mounted within the glass housing in order to reduce transmission of mechanical stress from the glass housing into the perovskite solar cells and to reduce thermal stresses across the perovskite solar cells during operation.

Therefore, in this example and as shown in FIG. 2, the solar cell system 100 can define a modular, hermetically sealed solar cell system 100 that can achieve both low manufacturing cost and high-power conversion efficiency of perovskite solar cells and the operational longevity of more traditional solar cell chemistries.

In a similar example, the method S100 can be executed: to grow or form a set of perovskite solar cells (e.g., via solution and/or vapor deposition) directly onto the interior surface of the glass housing; and to connect these solar cells to an electrode prior to sealing an end of the glass housing around the electrode. Therefore, in this example, the resulting solar cell system 100 can include a glass housing that both seals an environment around and forms a substrate on which perovskite solar cells are fabricated, thereby reducing manufacturing steps and complexity to manufacture the solar cell system 100.

In another example implementation, the method S100 can be executed to create a solar cell system 100 that includes: a set of adjacent, angularly offset rows of bifacial solar cells (e.g., perovskite or crystalline silicon solar cells) arranged within a first (e.g., top) sector of the circular cross-section of the glass housing; and an internal reflector arranged in a second (e.g., bottom) sector of the circular cross-section of the glass housing and facing the rows of bifacial solar cells.

In this example, units of the solar cell system 100 can be installed in a North-South orientation. Therefore, in this example, light incident on the solar cell system 100 when the sun is highest in the sky (e.g., between 10 AM and 2 PM) may strike the tops of the bifacial solar cells, which then convert this light into electrical energy. However, when the sun is lower to the horizon in the East or West, (e.g., between 5 AM and 9 AM and from 3 PM to 7 PM) some light incident on the solar housing may strike the internal reflector, which reflects this light to the back sides of the bifacial solar cells, which then convert this light into electrical energy.

In particular, in this example, the combination of solar cells arranged across a top or Sun-facing portion of the solar cell system and the internal reflector can function as a static, single-axis solar tracker that reflects light—incident on the glass housing but not immediately incident on these solar cells—back at these solar cells. Thus, in this example, the method S100 can be executed to manufacture a passive (or static) solar cell system 100 that exhibits high energy capture efficiency over a wide range of sun angles, seasons, and latitudes.

Generally, the method S100 is described below as executed to fabricate a solar cell system 100 containing a set of perovskite solar cells sealed within a cylindrical glass housing. However, Blocks of the method S100 can additionally and/or alternatively be implemented to seal solar cells of any other solar cell chemistry (e.g., silicon solar cells, perovskite solar cells, thin-film solar cells, tandem solar cells, organic solar cells) within a larger glass housing structure of any other geometry (e.g., defining an elliptical cross-section, a polygonal cross-section, a partially parabolic cross-section, or combination of polygonal and circular, elliptical, or parabolic cross-sections) containing a vacuum or a sealed gas atmosphere.

4.2 Flexible Solar Panel System

As shown in the FIGURES, the system 100 and method S100 described herein are applicable to the construction and deployment of a modular and flexible solar panel system 200. Generally, the flexible solar panel system 200 includes a set of tubular solar electric modules 100 electrically connected via an electrical harness and mechanically located between two cables configured for installation: between four posts, such as over an agricultural field or parking lot; along two rails, such as on a flat roof, a sloped roof, or vertical wall; or floating on a body of water.

In particular, the flexible solar panel 200 includes a set of rigid, tubular solar modules 100, each containing a set of sealed solar cells. The solar cell modules 100 are: arranged at a pitch offset corresponding to a target open area of a solar installation; mechanically connected on each end and supported by a pair of flexible cables; and electrically coupled, either in series or in parallel, by an electrical harness extending between these solar cell systems and adjacent one of these cables. For example, for a total projected open area of 80% at a ground plane below a flexible solar panel strung—and drooping—between a set of posts over an agricultural field, a set of 2-inch-diameter solar cell systems 100 can be attached to the set of cables at a 10-inch pitch offset with 8-inch open gaps between the solar cell systems.

Therefore, the mechanical and electrical connections at a first end of a solar cell module 100 can be approximately co-spatial. For a flexible solar panel 200 in which the ends of multiple solar cell modules 100 are connected mechanically with a flexible cable and electrically with a flexible wiring harness, the flexible solar panel 200 can be wound into a close-pack configuration, for example by spooling the flexible solar panel 200 for storage or shipping, without binding or fatiguing the mechanical or electrical connections between adjacent solar cell modules 100. The flexible solar panel 200 can then be unspooled—again without binding or fatiguing mechanical or electrical connections between adjacent solar cell modules 100—during installation between pairs of vertical support members, during installation between pairs or standoffs in vertical or sloping orientations, or during deployment onto a body of water. Once installed, the flexible solar panel 200 can flex and move with changes in wind conditions, thermal expansion due to changes in ambient conditions and solar exposure, etc.—again without binding or fatiguing mechanical or electrical connections between adjacent solar cell systems 100.

Furthermore, because the flexible solar panel 200 is constructed from a limited number of unique components, the flexible solar panel 200 can be customized for different applications requiring different open area fractions by installing the solar cell systems 100 at different pitch offsets along two standardized cables and assembling the wiring harness with connectors at corresponding pitch offsets. Furthermore, because each solar cell module 100 defines a singular, complete solar structure configured for assembly between two cables—rather than behind a glass pane—the output capacity, weight, material consumption, and cost of the flexible solar panel 200 can be directly correlated and controlled by pitch offset between adjacent solar cell modules 100.

5. Modular Solar Cell System

Figure 2A:
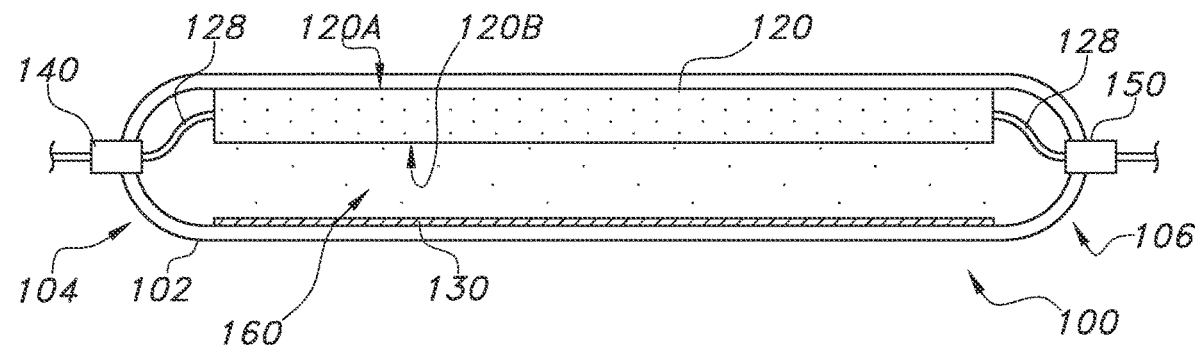
FIG. 2A is a schematic representation of a first solar cell system.
Figure 2B:
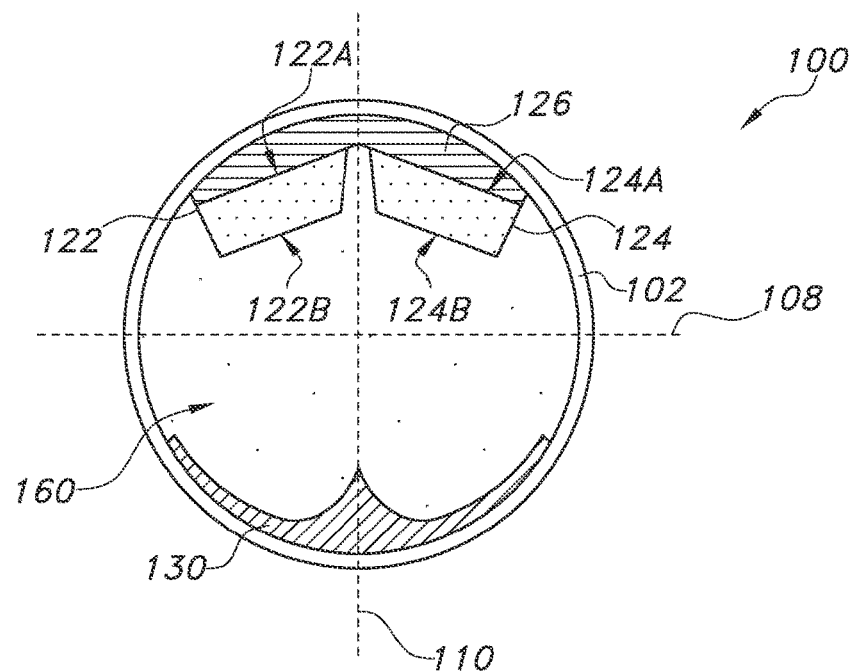
FIG. 2B is a cross-sectional representation of the first solar cell system.

As shown in FIGS. 2A and 2B, an exemplary modular solar cell system 100 can include: a set of solar cells 120 electrically coupled to a pair of terminals 140, 150; a glass housing 102 containing the set of solar cells 120 and sealed around and/or bonded to the pair of terminals 140, 150—such as via a matched seal and/or a compression seal—in order to hermetically enclose the set of solar cells 120 within a vacuum or a complementary gaseous atmosphere, thereby (indefinitely) stabilizing a perovskite material against degradation from moisture and oxidation. The solar cell system 100 can also include an optically transparent encapsulant 126 configured to adhere the set of solar cells 120 to an internal wall of the glass housing 102 in a desired geometry, as described in more detail below.

The exemplary solar cell system 100 defines a modular, hermetically sealed perovskite solar cell that can maintain high power conversion efficiency in a variety of environmental conditions over long time periods. In particular, the solar cell system 100 can include: a first terminal 140 bonded at a first end 104 of the glass housing 102 and electrically coupled to the set of solar cells 120; and a second terminal 150 bonded to an opposite end 106 of the glass housing 102 and electrically coupled to the set of solar cells 120. The pair of terminals can therefore define positive and negative terminals of the set of solar cells 120 configured to transfer power converted by the set of solar cells 120 to an external trace and/or power line connected to these terminals 140, 150, thereby enabling the solar cell system 100 to be interconnected in parallel and connected to a common (e.g., high voltage) DC line to form a solar panel and/or solar array.

5.1 Glass Housing

As shown in FIGS. 2A and 2B, the solar cell system 100 includes a glass housing configured to house the set of solar cells 120 and bond and/or adhere to each terminal 140, 150 about each terminal's 140, 150 perimeter during the sealing process. In particular, the glass housing 140 can define an elongated, rigid glass cylinder or cylindroid approximately fifteen to 200 millimeters in diameter and one-half meter to three meters in length and can therefore accept and house sets of solar cells 120 of similar dimensions. When sealed around a terminal 140 and/or pair of terminals 140, 150 according to Blocks of the method S100, the glass housing 102 defines a continuous hermetic enclosure that can maintain internal conditions around the set of solar cells 120 over very long timescales. Furthermore, the exemplary cylindrical or cylindroid geometry enables the glass housing 102 to contain and/or hold hard vacuum (e.g., pressures of millionths of an atmosphere, billionths of an atmosphere) and/or high pressures of interior gas atmosphere (e.g., pressures of tens of atmospheres, hundreds of atmospheres) at relatively minimal glass thicknesses (e.g., one to ten millimeters) without risk of structural damage.

As noted above, in one variation of the example implementation, the glass housing 102 defines a cylindrical shape having a circular cross section. As shown in FIG. 2B, the circular cross section can be defined in part by a first diameter 108 bisecting the cross-sectional area and a second diameter 110 orthogonally bisecting the first diameter 108. In another variation of the example implementation, the glass housing 102 defines a cylindroid shape having an elliptical cross section. In this variation, one of the first diameter 108 or the second diameter 110 can define the major axis of the elliptical cross section, while the other of the first diameter 108 or the second diameter 110 can define the minor axis of the elliptical cross section. In other variations of the example implementation, the glass housing 102 defines a spatially variable shape that can define a circular cross section along some portions of its length and an elliptical cross section along other portions of its length. In still other variations of the example implantation, the glass housing 102 defines a polyhedral shape having a polygonal cross section.

In an example implementation, the glass housing 102 can be formed from borosilicate glass with a low coefficient of thermal expansion, thereby reducing and/or preventing structural deformation of the glass housing responsive to temperature changes (e.g., during evacuation of the glass housing, during operation of the solar cell system 100). Furthermore, borosilicate glass can define an optical interface between the set of solar cells 120 and the external environment with relatively low dispersion and indices of refraction and/or reflection, thereby enabling incident sunlight to be transmitted through the glass housing 102 to the set of solar cells 120. Additionally, in this example implementation, the inner surface of the glass housing 102 can be highly resistant to chemical corrosion and/or degradation, enabling the glass housing 102 to hold gas atmospheres (e.g., methylammonium gas, halide gasses) around the set of solar cells 120 throughout the operational lifetime of the solar cell system 100.

In other implementations, the glass housing 102 can be formed from alkali-aluminosilicate glass, soda-lime glass, or any other type of glass or polymeric material having the desired mechanical, chemical, and/or thermal properties to enclose and protect the set of solar cells 120 for extended periods of time in various operating conditions.

5.2 Solar Cells

As shown in FIGS. 2A and 2B, the solar cell system 100 generally includes a set of solar cells 120 defining lengths that are slightly (e.g., five centimeters) shorter than the length of the glass housing 102. In particular, the distal end of each solar cell 120 can be arranged at a small longitudinal inset distance (e.g., three centimeters) from the adjacent end of the glass housing 102 in order to protect the set of solar cells 120 and/or associated electrical transmission wiring from melting and/or heat damage during sealing of the glass housing 102 according to the method S100. The solar cell system 100 can also include an encapsulant material 126 formed around a section of the set of solar cells 120 and bonded to an inner surface of the glass housing 102 in order to mechanically support the set of solar cells 120 within the glass housing 102 and/or fix the set of solar cells 120 in a particular position or orientation relative to the inner surface of the glass housing 102.

As shown in FIGS. 2A and 2B, the solar cell system 100 can include a set of solar cells 120 spanning the length of the glass housing 102 and configured to convert incident sunlight into electrical power, such as via the photoelectric effect. In one variation of the example implementation, the solar cell system 100 can include a perovskite solar cell (e.g., single junction perovskite solar cells, multi-junction perovskite solar cells) deposited on, formed on, and/or patterned across a flexible substrate such as a metal foil, which can be shaped into a curvilinear surface analogous to the curvature of the glass housing 102 prior to deposition of the perovskite material and/or prior to arranging the perovskite solar cell 120 within the glass housing 102. Additionally or alternatively, the solar cell system 100 can include solar cells 120 including silicon solar cells, thin-film solar cells, tandem solar cells, organic solar cells, or a combination or subcombination of any of the foregoing.

In one variation of the example implementation, the solar cell system 100 can include a set of (e.g., multiple) perovskite solar cells 120 that are deposited and/or formed on (separate) substrates 13 such as a planar strip of glass or metal—and radially offset from adjacent perovskite solar cells along the inner surface of the glass housing relative to its radial (e.g., central) axis, thereby increasing and/or maximizing the photosensitive surface area of the set of perovskite solar cells relative to the inner surface area of the glass housing and enabling more consistent and/or efficient energy harvesting across a range of sun altitudes (e.g., over the course of a day).

In another variation of the example implementation, the solar cell system 100 can include a set of tandem solar cells, each defining a perovskite solar cell arranged over—and co-planar with—a silicon solar cell or a thin-film solar cell (e.g., a gallium arsenide solar cell, a cadmium telluride solar cell or another perovskite solar cell exhibiting a different bandgap). In this implementation, incident light that is not absorbed by the perovskite solar cell is transmitted through the (transparent or partially transparent) perovskite material and captured by the underlying silicon solar cell or thin-film solar cell, thereby further increasing the power conversion efficiency of the solar cell system 100.

In another variation of the example implementation, the solar cell system 100 includes a set of bifacial solar cells 120 (e.g., perovskite solar cells, crystalline silicon solar cells, thin-film solar cells, or a combination thereof) that are photosensitive across both an outer surface adjacent to and facing the inner surface of the glass housing and an inner surface facing the center of the glass housing 102. For example, each bifacial solar cell 120 can include a solar cell formed and/or arranged on a transparent substrate of a high optical transmittance, such as a strip of borosilicate glass. In another example, each bifacial solar cell 120 can include: a first solar cell formed, deposited, and/or arranged on an outer surface of a substrate—such as a flexible substrate or rigid, planar substrate; and a second solar cell arranged on an inner surface of the substrate opposite the outer surface. As shown in FIGS. 2A and 2B, the set of bifacial solar cells 120 can be radially offset (and parallel to the longitudinal axis) of the glass housing 102 such that a planar surface of each bifacial solar cell 120 is substantially orthogonal to an imaginary line emanating from a central axis of the glass housing 102.

In another variation of the example implementation, the solar cell system 100 can include one or multiple bifacial solar cells 120 arranged on a flexible substrate, which is flexed or bent to form an arc when inserted into the glass housing 102. Similarly, the solar cell system 100 can include one or multiple bifacial solar cells 120 arranged on a curved substrate of radius (slightly) less than the internal radius of the glass housing 102

In another variation of the example implementation, the solar cell system 100 includes a set of perovskite solar cells 120 that are directly deposited, grown and/or formed on an inner surface of the glass housing 102 (e.g., via solution deposition and/or vapor deposition). In particular, prior to sealing the ends of the glass housing 102, Blocks of the method S100 can be executed to circumferentially etch or scribe the inner surface of the glass housing 102 and wash and/or spin-coat the inner surface of the glass housing 102 with a perovskite solution including complementary concentrations of perovskite precursor compounds (e.g., methylammonium halide, lead halide). Once spin coated onto the inner wall of the glass housing 102, the resulting layer of perovskite solution can be baked, washed with additional solvent and/or annealed in the presence of a specific vapor atmosphere to yield a film of crystallized (e.g., solid) perovskite material. The above methods and techniques can then be repeated to scale and/or grow the film of perovskite crystals, and thus the absorber layer of the perovskite solar cell 120, to a suitable thickness. Blocks of the method S100 can be executed to grow the set of perovskite solar cells 120 directly within the glass housing 102 prior to the sealing process, utilizing the inner surface of the glass housing 102 as a substrate, in order to further reduce manufacturing and assembly costs and/or manufacturing complexity of the solar cell system 100.

5.3 Reflective Element

As shown in FIGS. 2A and 2B, the solar cell system 100 can also include a reflective element 130 disposed in or on the glass housing 102 and configured to reflect incoming light, transmitted through the sides of the glass housing 102, back toward the inner surface(s) of the set of bifacial solar cells 120. As shown, the reflective element 130 can be arranged on a side of the first diameter 108 opposite the set of solar cells 120. Generally, the reflective element 130 can be a diffuse reflector or specular reflector, or a combination thereof. In one variation of the example implementation, the reflective element 130 can include a coating, such as a white or mirrored paint, deposited on an interior or exterior surface of the glass housing 102. Alternatively, the reflective element 130 can include a solid structure having a defined geometry configured to reflect incident light in a particular direction. For example, as shown in FIG. 2B, the reflective element 130 can define one or more parabolic reflectors, each configured to receive and reflect incident light to one or more of the set of solar cells 120. Alternatively, the reflective element 130 can be configured in a compound parabolic geometry or a scalloped mirror geometry to optimize the capture and reflection of photons at various orientations, latitudes, or climate conditions. In another variation of the example implementation, the reflective element 130 can also function as a weight or ballast (e.g., heavier than the set of solar cells 120) to maintain a favored orientation of the solar cell system 100 in deployments in which the solar cell system 100 can rotate about its longitudinal axis.

In this example implementation, the reflective element 130 can function as a passive solar tracker to increase the efficiency of the set of solar cells 120. As noted above, in some instances a certain amount of light can be transmitted through the solar cell material. The reflective element 130 can therefore reflect this transmitted light back toward a rear-facing surface 120B of the set of solar cells 120 thereby potentially increasing the probability that an incident photon will be absorbed by the set of solar cells 120. Likewise, the reflective element 130 can redirect incident light that enters the glass housing 102 through a lower angle of incidence. In particular, when the solar cell system 100 is arranged along a substantially geographic North-South axis, the reflective element 130 can reflect sunlight that would otherwise bypass an outward-facing photosensitive surface 120A of the set of solar cells 120—such as at lower sun altitudes during the early morning and late afternoon—toward an inner photosensitive surface 120B of the set of solar cells 120, thereby increasing the overall power conversion efficiency of the solar cell system 100 and enabling more even production of solar power over a range of sun angles throughout various times of day and latitudes.

5.4 Electrode and Electrical Connections

As shown in FIGS. 2A and 2B, the solar cell system 100 includes a pair of terminals 140, 150, each including a conductive body such as a metal plate, disk, and/or wire bonded to and/or sealed into an end of the glass housing 102 during assembly. In one example implementation, the terminals 140, 150 are continuous between the interior of the glass housing 102 and the exterior of the glass housing 102 such that the glass housing 140, 150 is sealed around, about, or cooperatively with each of the terminals 140, 150. Generally, the terminals 140, 150 are configured to conduct electrical current generated by the set of solar cells 120 to traces and/or wiring connected to the terminals 140, 150, thereby enabling electrical current converted by the solar cell system 100 to be routed externally (e.g., to a shared power line or panel including the solar cell system 100, to an inverter). As shown in FIG. 2B, each terminal 140, 150 can be connected to the set of solar cells 120 via a conductive tabbing ribbon 128 or wire coupled between the terminal 140, 150 and the set of solar cells 120 that communicates current generated by the set of solar cells 120 and a corresponding terminal 140, 150.

In one variation of the example implementation, the solar cell system 100 can include a single terminal 140, 150 located on one of the first or second ends 104, 106 of the glass housing 102 that functions as both a ground and a potential terminal. In this variation, rather than a pair of terminals 140, 150 that function to route current in a single direction (e.g., toward terminal 150, a single terminal 140 can function as a ground or as a high potential connector for current that is routed in a circular fashion (e.g., clockwise around a pair of sets of solar cells 120. In a single-terminal configuration, the glass housing 102 can have one of its ends 104, 106 sealed completely during assembly while the other end 104, 106 is sealed on, about, or with the single terminal 140, 150, thus potentially reducing manufacturing costs and complexity.

Generally, the material properties and composition of the terminals 140, 150 can be selected to match the manufacturing and operating characteristics of the solar cell system 100. For example, the conductive material forming the body of the terminal 140, 150 can be selected to match the coefficient of thermal expansion and/or other thermal properties of the glass housing 102 in order to increase adhesion between the terminal surface and (melted) glass during the sealing process. For example, in one example implementation in which the glass housing 102 includes soda-lime glass, the solar cell system 100 can include terminals 140, 150 with an iron-nickel (e.g., Dumet) and/or platinum body defining a coefficient of thermal expansion similar to the coefficient of thermal expansion of soda-lime glass. In another example implementation in which the glass housing 102 includes borosilicate glass, the solar cell system 100 can include terminals 140, 150 with an iron-nickel-cobalt (e.g., Kovar) body defining a coefficient of thermal expansion similar to the coefficient of thermal expansion of borosilicate glass.

In a variation of the example implementations, the terminals 140, 150 can include a thin layer of an inert metal (e.g., gold) plated over the terminals 140, 150 to stabilize the terminals 140, 150 against corrosion from gas atmospheres sealed within the glass housing 102. Moreover, the terminal body can itself be formed from tungsten, molybdenum, or another inert conductor in order to reduce or eliminate chemical reactivity between a portion of the terminals 140, 150 located within the glass housing 102 and certain components of these gas atmospheres 160 (e.g., methylammonium gas, halide gasses), thereby reducing and/or preventing corrosion or degradation of the terminals 140, 150 over the operational lifespan of the solar cell system 100.

In another variation of the example implementation, each terminal 140, 150 can also include a layer of oxide formed on the surface of the terminal body, defining a thickness proportional to the dimensions of the terminal 140, 150 and/or matched to the glass type and thickness of the glass housing 102. For example, during the sealing process, oxides within the oxide layer can intersperse with (e.g., diffuse into) analogous oxides in the (melted) glass, thereby significantly increasing adhesion and/or bonding between the glass housing 102 and an adjoining surface of the terminal 140, 150 upon cooling.

6. Method of Manufacture

A solar cell system 100 of the type described above can be manufactured and assembled by executing Blocks of the method S100. As shown in FIG. 1, Block 110 of the method S100 recites arranging a set of perovskite solar cells within a glass housing defining a first coefficient of thermal expansion. Generally, prior to evacuation and/or sealing of the glass housing 102, a set of perovskite solar cells 120 are arranged along the length of the glass housing 102 such that these perovskite solar cells 120 span and/or cover a majority of the inner surface area of the upper half of the glass housing 102. In one example implementation, the set of perovskite solar cells 120 is formed on a flexible and/or curvilinear substrate matching the curvature of the glass housing 102, which is then inserted into an open end of the glass housing 102. In another example implementation, each perovskite solar cell 120 can be formed on a separate (planar) substrate, inserted into an open end of the glass housing 102 and/or arranged within the glass housing 102 such that each perovskite solar cell 120 is positionally offset from adjacent perovskite solar cells 120 along an inner circumference of the glass housing 102. In the above example implementations, the set of perovskite solar cells 120 can then be coupled to and/or attached to the glass housing 102 at a particular position and orientation via an encapsulant material 126 formed around the set of perovskite solar cells 120 and bonded or adhered to the inner surface of the glass housing 102. In yet another example implementation, the set of perovskite solar cells 120 can be solution deposited, grown, and/or formed directly on the inner surface of the glass housing 102 prior to sealing the glass housing 102 according to the methods and techniques described herein.

As shown in FIG. 1, Block S120 of the method S100 recites evacuating an ambient gaseous atmosphere from the glass housing and around the set of perovskite solar cells. Generally, the open end of the glass housing 102 can be connected to a vacuum pump or other pressure differential in order to remove air and/or other ambient atmosphere from the interior of the glass housing 102, thereby removing substantially all oxygen and moisture from the internal environment of the glass housing 102 surrounding the set of perovskite solar cells 120. Generally, the glass housing 102 can exhibit a wall thickness sufficient to maintain structural stability of the solar cell system 100 during the sealing process and during deployment and operation of the solar cell system 100 while a low internal pressure (e.g., one millionth of an atmosphere) is maintained within the glass housing 102. In executing Block S120 of the method S100, trace contaminants (e.g., oxygen and water molecules)—which might otherwise damage or reduce efficiency of the perovskite solar cells 120—can be evacuated from the glass housing 102 during the sealing process in order to extend a predicted life of the solar cell system 100 to multiple decades.

In variations of the example implementation, the method S100 can further include injecting a perovskite-compatible gaseous atmosphere into the glass housing in Block S130. For example, the glass housing 102 can be backfilled with an atmosphere of inert or noble gas, such as nitrogen or helium gas, thereby excluding oxygen and water from the interior of the glass housing 102 while reducing strain (e.g., due to a pressure differential between internal vacuum and the external atmospheric pressure) on the surface of the glass housing 102 throughout the operational lifetime of the solar cell system 100.

In another variation of the example implementation, the interior of the glass housing 102 can be backfilled with a gas atmosphere analogous to the cell chemistry of the set of perovskite solar cells 120 in order to stabilize, balance, and/or equilibrate the degradation route (e.g., degradation reaction) of the perovskite material. In particular, in implementations in which the set of perovskite solar cells 120 include a methylammonium lead halide chemistry, the glass housing 102 can be backfilled with a gaseous atmosphere including methylamine gas and hydrogen halide gas at complementary partial pressures (e.g., less than one atmosphere), thereby (indefinitely) stabilizing and/or arresting the natural degradation of the perovskite crystal structure into these gaseous byproducts. Accordingly, Blocks of the method S100 can be executed in order to: evacuate oxygen, water, and/or humidity from the interior of the glass housing 102, which would otherwise degrade perovskite material within the set of perovskite solar cells during operation; and confine specific gas atmospheres within the interior of the glass housing 102 prior to sealing in order to stabilize particular perovskite solar cell chemistries.

As shown in FIG. 1, Block S140 of the method S100 recites electrically coupling a terminal 140, 150 including an oxide layer and a conductive material defining a second coefficient of thermal expansion substantially equivalent to the first coefficient of thermal expansion to the set of perovskite solar cells 120 at a proximal end of the set of perovskite solar cells 120. Generally, the set of perovskite solar cells 120 can be electrically coupled to a terminal 140, 150 arranged at an open end of the glass housing 102 and/or within the glass housing 102 via a conductive tabbing ribbon 128 connected (e.g., soldered or welded) between the terminal 140, 150 and a set of solar cell electrodes of the set of perovskite solar cells 120. In one variation of the example implementation, the conductive tabbing ribbon 128 and its connection to the terminal 140, 150 can exhibit melting points higher than the melting point of the glass housing 102 in order to maintain the electrical connection between the terminal 140, 150 and the set of perovskite solar cells 120 when exposed to elevated temperatures during the sealing process. Additionally, the conductive tabbing ribbon 128 can be plated with a thin layer of chemically inert, protective material, such as a layer of gold or protective polymers to prevent degradation and/or corrosion of the conductive tabbing ribbon 128 over the operational lifespan of the solar cell system 100.

Blocks of the method S100 can be executed to achieve an airtight, matched seal between a terminal 140, 150 and the glass housing 102 that seals the interior conditions of the glass housing 102 from external environmental conditions. For example, the method S100 can further include melting a section of the glass housing 102 proximal a distal end of the set of perovskite solar cells 120 in Block S150; and bonding a section of the glass housing 102 about the terminal 140, 150 to seal the gaseous atmosphere around the set of perovskite solar cells 120 within the glass housing in Block S160. Generally, after evacuating and/or backfilling the glass housing 102, the glass housing 102 is heated (e.g., via a localized gas flame) about a localized section of its perimeter that surrounds one of the terminals 140, 150. Upon achieving a sufficiently low viscosity, the molten glass is then deformed and/or collapsed toward the longitudinal axis of the glass housing 102 into contact with the terminal 140, 150, enclosing the terminal 140, 150 about a continuous section of its surface, enabling the oxide layer on the terminal 140, 150 to diffuse into oxides within the molten glass and yielding a strong adhesive bond between the glass and the oxide surface of the terminal 140, 150. As described above, the material of the terminal body (e.g., iron-nickel-cobalt, tungsten, molybdenum) can generally exhibit a coefficient of thermal expansion that is equal or substantially equal to the coefficient of thermal expansion of the glass (e.g., borosilicate glass) in order to maintain adhesion between the glass and the electrode surface as the glass cools and solidifies, thereby yielding an airtight and matched seal between the glass housing 102 and the terminal 140, 150.

In another variation of the example implementation, the solar cell system 100 can additionally and/or alternatively include a metal ring arranged at one or both ends 104, 106 of the glass housing 102 during the sealing process and configured to compress the glass housing 102 about the surface of the terminal 140, 150. The metal ring can include a band of structural metal—such as steel, aluminum, or an aluminum alloy—of a geometry similar to and matching the surface dimensions of the terminal 140, 150 and defining a coefficient of thermal expansion greater than the coefficient of thermal expansion of the glass housing 102.

During the sealing process, as the molten glass cools and solidifies, the metal ring contracts at a faster rate than the underlying glass, thereby exerting substantial compressive forces that further increase adhesion and seal strength between the glass housing 102 and the terminal 140, 150. In use, the metal ring can provide a strong, dimensionally stable endcap of the glass housing 102 around the terminal 140, 150 that can further improve and/or maintain the strength of the seal throughout the operational lifespan of the solar cell system 100. Furthermore, in this variation of the example implementation, compressive forces applied around the seal by the metal ring can augment and/or replace adhesion yielded by matching coefficients of thermal expansion between the glass housing 102 and the terminal 140, 150, thereby enabling the solar cell system 100 to include a wider range of metals and/or metal alloys in the terminal body and a wider selection of potential matching glass materials for the glass housing 102.

7. Flexible Solar Panels

Figure 3:
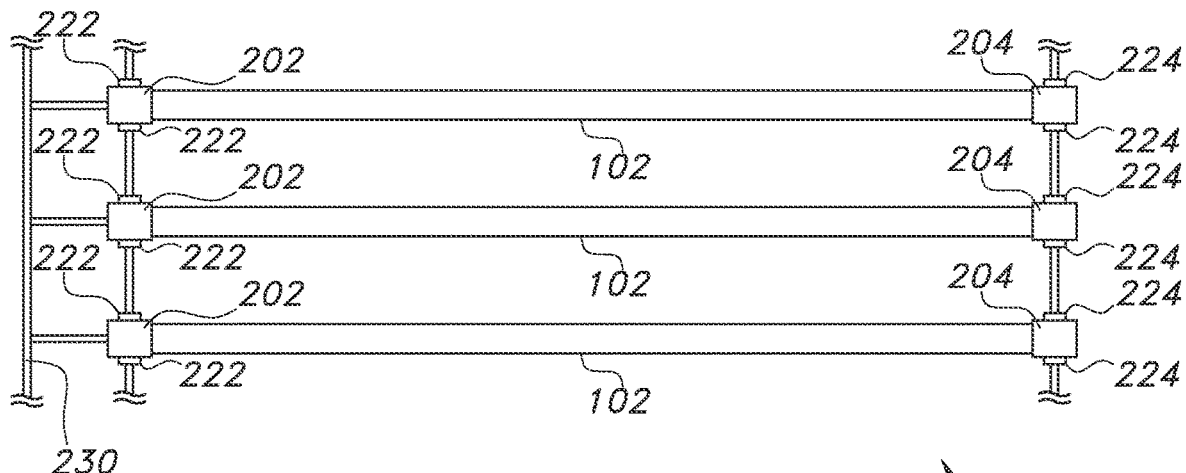
FIG. 3 is a schematic representation of a first solar panel system.

As shown in FIGS. 3, 4, 5A, 5B, 5C, and 5D, each of the solar cell systems 100 can function as a modular segment or portion of a larger flexible solar panel 200. In an example implementation shown in FIG. 3, a set of solar cell systems 100 is arranged along a first and second wire rope (hereinafter "cable") 212, 214 such that the glass housings 102 are arranged in a substantially mutually parallel orientation. As shown in FIG. 3, each of the solar cell systems 100 can be affixed to the cables 212, 214 by a set of fiducials 222, 224 that cooperate with end caps 202, 204 to maintain a desired and fixed parallel spacing between the solar cell systems 100. As described in more detail below, the respective caps 202, 204 can further function to route electrical connections between each of the sets of solar cells 120 and an electrical transmission wire defined by an external transmission line 230. Additionally, in some variations of the example implementation, the caps 202, 204 can further function as terminals 140, 150 and provide both electrical connectivity and sealing properties to the solar cell systems 100.

7.1. Solar Cell System Interfaces

As shown in FIGS. 3, 4A, 4B, and 4C, each solar cell system 100 further includes a set of mechanical connectors (hereinafter "caps") 202, 204 arranged on the ends of the glass housing 102, configured to couple to a pair of cables 212, 214, configured to carry the weight of the solar cell system 100 into these cables 212, 214, and configured to connect the set of solar cells systems 100 to an external transmission line 230 that transmits the generated electricity to a battery, an electrical load, or an electrical power grid.

Figure 4A:
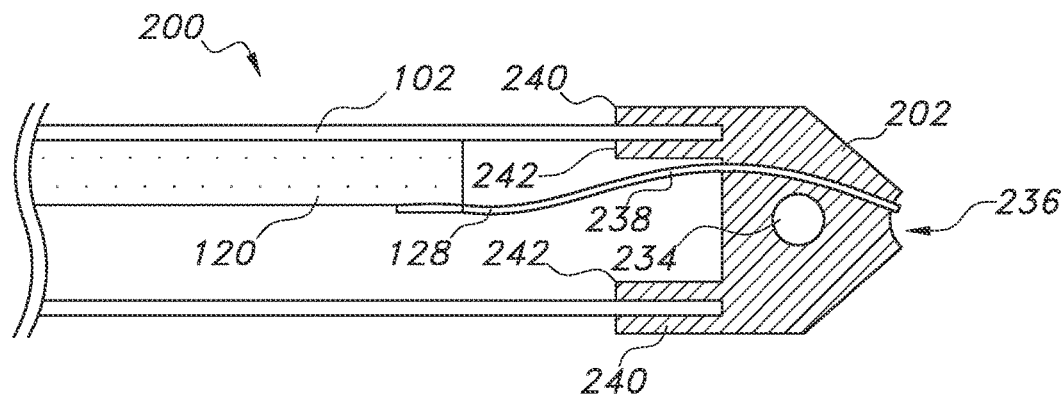
FIG. 4A is a sectional representation of a section of the first solar panel system.
Figure 4B:
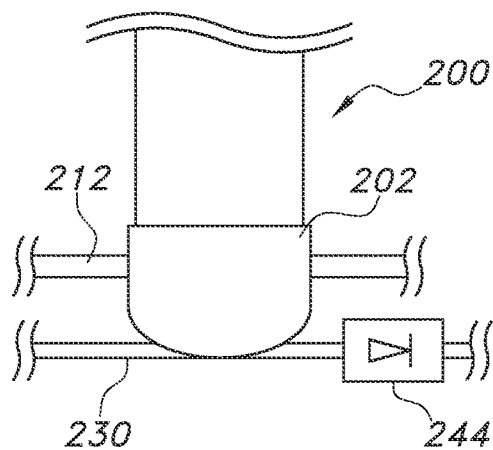
FIG. 4B is a schematic representation of the first solar panel system.
Figure 4C:
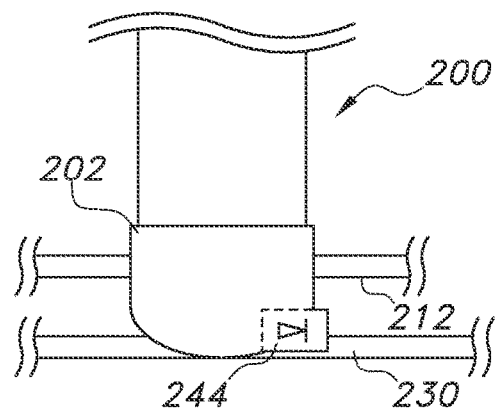
FIG. 4C is a schematic representation of the first solar panel system.

In one example implementation, each of the first and second caps 202, 204 can include a cable bore 234 through which either the first or second cable 212, 214 can be passed. As shown in FIGS. 4A, 4B, and 4C, the cable bore 234 can be oriented perpendicularly to the glass housing 102 such that, when strung together into a flexible solar panel 200, the glass housings 102 are mutually perpendicular to the cables 212, 214 and mutually parallel to one another. The first and second caps 202, 204 can also include mechanical structures and/or adhesive compounds to counter external stresses on the flexible solar panel 200 that would tend to separate the first and second caps 202, 204 from the glass housing 102. As shown in FIGS. 4A, 4B, and 4C, each of the first and second caps 202, 204 can include an inner flange 242 defining an outer perimeter and an outer flange 240 defining an inner perimeter. In this example implementation, the outer perimeter of the inner flange 242 and the inner perimeter of the outer flange 240 can be configured geometrically to cooperatively and hermetically engage an inner surface and an outer surface of the glass housing 102, thus applying circumferential and consistent retaining forces against the glass housing 102 and preventing accidental separation between the glass housing 102 and the cap 202, 204. Additionally, an epoxy or other adhesive can be deposited or injected into the space between the inner and outer flanges 242, 240 to further adhere and connect the glass housing 102 and the caps 202, 204.

As shown in FIG. 4A, in one variation of the example implementation, the cable bore 234 is located at a position that is substantially coplanar with an imaginary plane that bisects the glass housing 102 into top and bottom sections (e.g., the first diameter 108 denoted in FIG. 2B in the case of a circular cross section). Therefore, the cable 212, 214 interfaces with the cap 202, 204 along its center of mass and along a central axis of the solar cell system 100. Alternatively, the cable bore 234 can be offset from the central axis of the cap 202, 204 to accommodate additional torsional forces caused by additional or optional configurations of solar cells 120 or reflective elements 130 within the glass housing 102. As shown, the outboard indentation 236 is disposed in the same plane as the cable bore 234. However, the relative orientation of the outboard indentation 236 and the cable bore 234 can be modified or adjusted to accommodate any desired geometry or weight distribution of the solar cell system 100.

In another aspect of the example implementation, the first cap 202 can be configured to directly connect the solar cell system 100 to the external transmission line 230. As shown in FIG. 4A, the first cap 202 can include an outboard indentation 236 along which the transmission line 230 can be mechanically affixed to the solar cell system 100 and electrically coupled to the sets of solar cells 120 within each glass housing 102. An epoxy or other adhesive can affix the transmission line 230 to the first cap 202. Alternatively, a non-conductive clamp (e.g., selectively removable) can affix the transmission line 230 to the first cap 202.

The first cap 202 can also include an electrode 238 electrically coupling or connecting the set solar cells 120 to the transmission line 230. As shown in FIG. 4A, the electrode 238 can be integral or embedded within the first cap 202 and configured to provide an electrical contact to engage the transmission line 230 within the outboard indentation 236. Therefore, when assembling the flexible solar panel 230, for each of the solar cell systems 100: the first cap 202 is affixed to the glass housing 102 and electrically connected to the set of solar cells 120 via the electrode 238. The solar cell systems 100 are then aligned and affixed to the cables 212, 214, for example by threading the cables 212, 214 through the respective cable bores 234 in the first and second caps 202, 204. The flexible solar panel 200 can then be deployed to a desired site (described in detail below) and engaged by affixing the transmission line 230 to the first cap 202 of each of the solar cell systems 100, thereby delivering electrical current from the respective sets of solar cells 120 through to the transmission line 230 and to its desired endpoint. In some variations of this example implementation, a grounding line or wire (not shown) can be affixed to the second cap 204 to provide a ground potential at each of the respective sets of solar cells 120.

In another variation of the example implementation shown in FIG. 4B, the solar cell systems 100 can include a current protection circuit 244 electrically connectable to the transmission line 230 and configured to prevent reverse current flow(s) into the sets of solar cells 120 within each solar cell system 100. The current protection circuit 244 can be an external circuit or electrical coupling arranged between adjacent solar cell systems 100 along the transmission line 230.

Alternatively, as shown in FIG. 4C the current protection circuit 244 can be integrated into or integral with the first cap 202. In this alternative implementation, the current protection circuit 244 is automatically connected to the transmission line 230 along with the first cap 202 and as the flexible solar panel system 200 is becoming operational and electrified. The current protection circuit 244 can be arranged or disposed adjacent the electrode 238, for example as a diode (e.g., a protection diode) or other similar electronic device (e.g., integrated circuit) that biases the flow of current along the transmission line 230 between adjacent solar cell systems 100 or sets of adjacent solar cell systems 100. Alternatively, the current protection circuit 244 can be configured as a separate module or circuit that is configured to cooperate with the electrode 238 to bias current flow away from the set of solar cells 120.

In another variation of the example implementation, one or both of the ends of the glass housing 102 can be sealed prior to interfacing with the caps 202, 204. For example, as shown in FIG. 1, a second end 106 of the glass housing 102 can be enclosed, either upon itself or on or about a terminal 150 as shown. The second cap 204 can be affixed to, around, or about the sealed second end 106 using an epoxy or other adhesive. Similarly, the first end 104 of the glass housing 102 can be sealed through mating with the first cap 202 in a manner described above. In another alternative implementation, both ends 104, 106 of the glass housing 102 can be sealed around or about terminals 140, 150, and separate caps 202, 204 that are configured to affix to cables 212, 214 can be affixed to the solar cell system 100 to, around, or about the terminals 140, 150. In yet another alternative, the terminals 140, 150 can function as caps 202, 204 by including: a cable bore 234, an outboard indentation 236, and/or a current protection circuit 244 to electrically and mechanically couple to the cables 212, 214 and transmission line 230.

As shown in FIG. 3, the flexible solar panel 200 can be configured as a set of mutually parallel solar cell systems 100 disposed along the cables 212, 214. Therefore, the flexible solar panel 200 can include a set of fiducials 222, 224 that are selectively attachable to the first and second cables 212, 214 to affix and locate each of the solar cell systems 100 along the first and second cables 212, 214. The set of fiducials 222, 224 can be configured to cooperate with the first and second cable bores 234 (within each of the first and second caps 202, 204) to retain, restrain, or immobilize the respective caps 202, 204 relative to the cables 212, 214 threaded therethrough. For example, the set of fiducials 222, 224 can include a fastener such as a set screw, ferrule, grommet, clamp, or sinkable nut that can be arranged or disposed adjacent to, within, or partially within the first and second cable bores 234 and mechanically cooperate to prevent movement of the cable 212, 214 relative to the first and second caps 202, 204. In one example implementation, the set of fiducials 222, 224 can be composed of a soft, deformable material such as plastic, rubber, soft metal, or a combination thereof that can be irreversibly arranged into a selected position along the cable 212 and against which the first and second caps 202, 204 are substantially immovable.

For example, during assembly the cables 212, 214 can be marked with indicia of proper spacing for the respective solar cell systems 100 included in the flexible solar panel system 200. Each of the caps 202, 204 can be associated with a pair of fiducials 222, 224 (e.g., fore and aft fiducials), and the each of the cables 212, 214 can be threaded through the respective caps 202, 204 and associated fiducials 222, 224. Once the proper position of the solar cell system 100 is determined and confirmed according to the indicia along the cables 212, 214, the fiducials 222, 224 can be affixed or irreversibly arranged into their permanent positions relative to or cooperating with the caps 202, 204 to permanently position the solar cell system 100. This process can be repeated in series or in parallel for all of the solar cell systems 100.

Once a set of solar cell systems 100 are thus installed on a set of cables 212, 214, the resulting flexible solar panel 200 can be rolled up in a cylindrical roll for storage and/or shipping. For example, the flexible solar panel 200 can be rolled into a coil approximating a cylinder and stored in a flexible sleeve or rigid drum. Moreover, the flexible solar panel 200 can be wound around a spool and then wrapped, such as with protective soft material around the outside wound spool and/or between each layer of solar cell systems 100 on the spool, for extended storage and/or transportation to its destination.

7.2 Interface Variations

Figure 5:
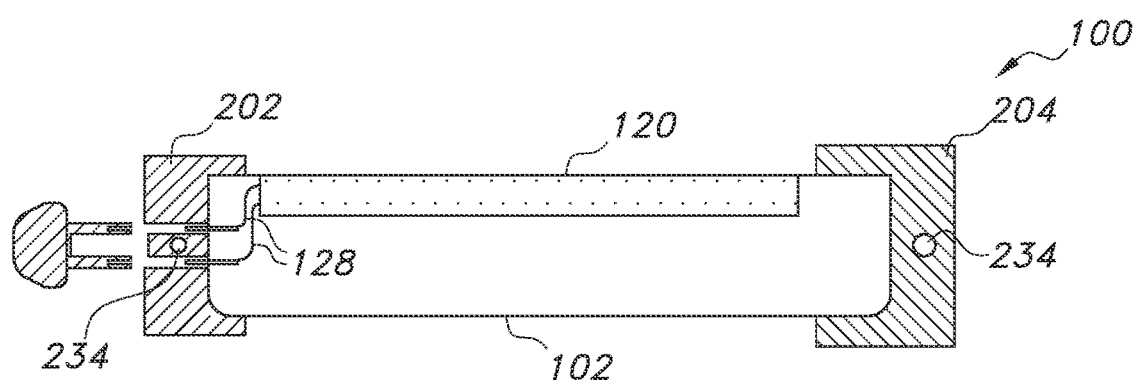
FIG. 5 is a sectional representation of a section of the first solar panel system.
Figure 6:
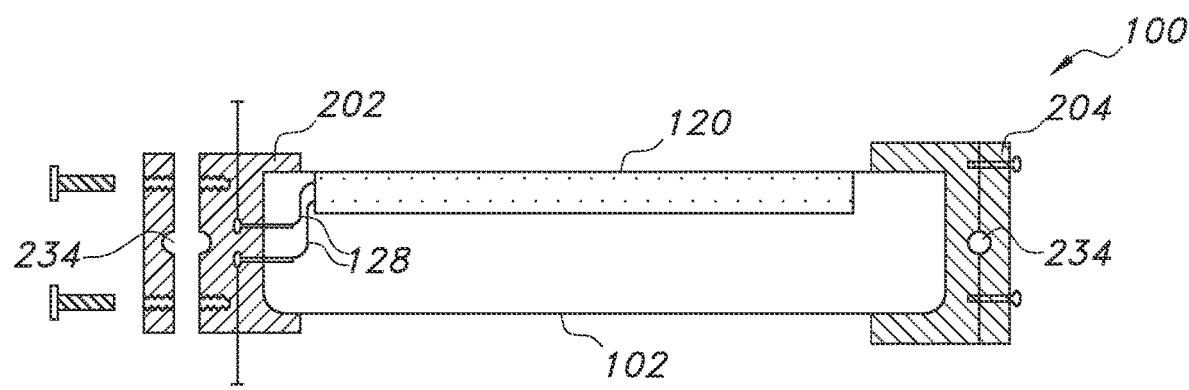
FIG. 6 is a sectional representation of a section of the first solar panel system.
Figure 7:
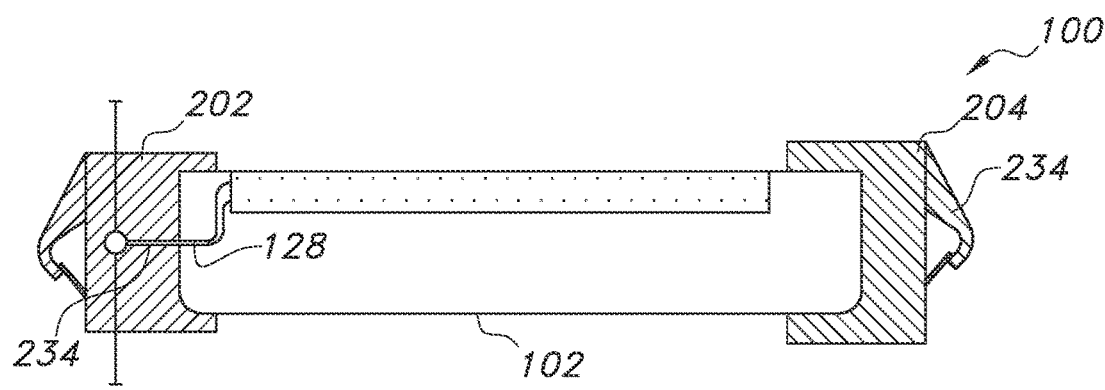
FIG. 7 is a sectional representation of a section of the first solar panel system.

In variations of the example implementation shown in FIGS. 5, 6, and 7, the solar cell system 100 includes a first cap 202 arranged on a first end of the solar cell system 100 and a second cap 204 arranged on a second end of the glass housing 102. As shown, the ends of the glass housing 102 are sealed. However, as noted above, one or both of the ends of the glass housing 102 can also be sealed by permanently affixing the caps 202, 204.

7.2.1 Cable Bore Interface

In the example implementation shown in FIG. 5, the first cap 202 can define an internal tube bore sized for a running fit with the first end of the glass housing 102. The first cap 202 can also include a set of pin bores or other electrical connectors that can be oversized for receiving electrical pins from the set of solar cells 120. To assemble the first cap 202 onto the first end of the glass housing 102, a UV-stable epoxy is loaded into the tube bore in the first cap 202; the electrical pins from the set of solar cells 120 are then aligned with the pin bores in the first cap 202, and the first end of the glass housing 102 is inserted into the tube bore with electrical pins extending into and offset from the pin bores. The epoxy thus bonds the first end of the glass housing 102 to the first cap 202 with the electrical pins physically isolated from the first cap and accessible to a plug connector.

In this example implementation, the first cap 202 can be fabricated in a conductive material, such as diecast aluminum. Accordingly, the pin bores in the first cap 202 can be oversized for the electrical pins, and the gap between each electrical pin and its corresponding pin bore can be filled with a potting material, such as with the epoxy described above concurrent with assembly of the first cap onto the first end of the glass housing 102 or with a silicone rubber gel after assembly of the first cap onto the first end of the glass housing 102. Alternatively, the first cap 202 can be manufactured in a non-conductive material, such as molded fiberglass or an injection-molded UV-stable polymer (e.g., PVDF, PTFE); and the pin bores in the first cap can be sized for a close (e.g., running) fit with the electrical pins such that the first cap mechanically supports these pins cantilevered from the first end of the glass housing 102.

In this example implementation, the first end of the glass housing 102 can also include retention features configured to mechanically resist separation of the glass housing 102 from the cap. For example: a convex dimple can be molded into the glass housing near its first end when the first end of the glass housing 102 is closed during manufacture; and the first cap 202 can define a complementary receiver in the tube bore and perpendicular to the longitudinal axis of the tube bore. The dimple on the glass housing 102 can thus seat in the receiver once the first end of the glass housing 102 is inserted into the first cap 202. Alternatively, the tube bore can define an L-shaped groove; the first end of the glass housing 102 can be inserted into the first cap 202 by aligning the dimple to a longitudinal section of the groove and then rotating the glass housing 102 to seat the dimple in the radial section of the groove, thereby longitudinally locking the first cap 202 to the first end of the glass housing 102.

As shown in FIG. 5, the first cap 202 defines a cable bore 234 passing through its body perpendicular to and in line with the axis of the glass housing 102 such that the cable bore passes between the two pins—extending from the first end of the glass housing 102 offset above and below the axis of the glass housing 102. The second cap 204 can similarly define a cable bore 234 passing through its body perpendicular to and in line with the axis of the glass housing 102.

In this implementation, the glass housing 102 can be assembled onto the first and second cables 212, 214 by inserting the first cable 212 through the cable bore 234 of the first cap 202 and inserting the second cable 214 through the cable bore 234 of the second cap 204. Ferrules or other fiducials can then be clamped to the first and second cables 212, 214 on each side of the first and second caps 202, 204, as described above.

Alternatively, a first set screw (not shown) can be installed in a threaded bore in the first cap 202—such as perpendicular to the cable bore 234—and tightened against the first cable 212 in order to bind and lock the first cap 202 in position on the first cable 202; and a second set screw can be similarly installed in a threaded bore in the second cap 204 and tightened against the second cable 214 in order to bind and lock the second cap 204 in position on the second cable 214.

In the example implementation shown in FIG. 5, an electrical harness includes: a set of conductive wire segments (e.g., insulated high-voltage braided copper wires); a series of female plug connectors (electrically connected in parallel or in series) arranged along the conductive wire segments at a pitch distance equal to (or slightly greater than) a pitch distance between the solar cell system 100 arranged along the first and second cables 112, 14; and an inter-panel connector at one or both ends of the conductive wire segments configured to electrically couple to a load or to an adjacent flexible solar panel 200.

The example electrical harness can thus form a contiguous "wiring harness" spanning the length of the flexible solar panel 200. This electrical harness can thus be installed on the flexible solar panel 200 by inserting each female plug connector into a corresponding pin socket (or pin socket pair) in the first cap 202 of each solar cell system 100 in the flexible solar panel 200.

As shown in FIG. 5, in this implementation, each female plug connector can include a pair of pin receptacles configured to receive and electrically couple to an electrical pin extending from the first end of a solar cell system 100 in the flexible solar panel 200. In this example, a female plug connector can include: a U-shaped base; and a pair of bosses extending from the U-shaped base, offset by the distance between the two pins, and each housing a female pin receptacle.

To assemble the solar cell system 100 into the flexible solar panel 200, the bosses of the female plug connector can be inserted into the pin sockets formed by the bores in the first cap 202 with the base of the female plug connector seating over or near the first cable 212. Therefore, when the female plug connector is installed on the solar cell system 100, the bosses of the female plug connector can: insulate the pins from the first cap 202; mechanically support the pins within their corresponding pin bores in the first cap 202; and electrically couple the female pin receptacle in each female plug connector to its corresponding pin in the solar cell system 100. Furthermore, in this example, the first cap 202 can form a rigid structure around the set of pins, thereby protecting the set of pins from damage when the female plug connector is removed from the first cap 202, such as during manufacture of the solar cell system 100, during initial assembly of the flexible solar panel 200, or during field maintenance of the flexible solar panel 200.

Alternatively, the electrical pins of a solar cell system 100 can extend through and beyond the first cap 202 of the solar cell system 100, and the female plug connector can be installed over these pins with the first cable located between the solar cell system 100 and the female plug connector. In another alternative, the electrical harness includes a set of individual "jumpers," each jumper: configured to connect the first electrical pin of a first solar cell system 100 to a second electrical pin of an adjacent solar cell system 100; and including a wire section configured to wrap, clip, or tie to an adjacent section of the first cable 212.

In another alternative implementation, the first cap 202 defines two blind pin bores: that extend into the base of the solar cell system 100 bore parallel to the longitudinal axis of the bore and solar cell system 100; that terminate before the distal (i.e., outer) end of the first cap 202; and that are vertically offset from the axis of the solar cell system 100 by the pitch distance between the two pins extending from the first side of the solar cell system 100. In this implementation, the first cap 202 also includes electrical sockets extending from the outer surface of the first cap to the two pin bores. For example, the first cap 202 can include: a first electrical socket extending from the front of the first cap, perpendicular to the axis of the solar cell system 100, and meeting the upper pin bore in the first cap near the upper pin of the solar cell system 100; and a second electrical socket extending from the rear of the first cap 202, perpendicular to the axis of the solar cell system 100, and meeting the lower pin bore in the first cap 202 near the lower pin of the solar cell system 100.

In this implementation, the first cap 202 can also include a cable bore 234 arranged between the distal end of the first cap 202 and the bases of the pin bores. (Alternatively, a hook, continuous loop, or other cable interface can be arranged on or near the distal end of the first cap, as described herein.) The first cap 202 can thus be installed and located on the first cable 212, such as described above, with the first cable 212 coupled to the first cap 202 between the distal end of the first cap 202 and the electrical pins.

Furthermore, in this implementation, the electrical harness can include: a first plug configured to insert into the first electrical socket on the front of the solar cell system 100 and to make electrical contact with the upper pin of the solar cell system 100; a second plug configured to insert into the second electrical socket on the rear of the solar cell system wo and to make electrical contact with the lower pin of a next solar cell system 100 in the flexible solar panel 200; and an insulated conductive wire (e.g., a braided copper ribbon) connecting the first and second plugs. Therefore, for each pair of adjacent solar cell systems 100 in the flexible solar panel 200, the system can include one electrical harness arranged between and connecting the upper and lower pins of this pair of adjacent solar cell systems 100 in series.

As noted above, the electrical harness can also include a set of current protection circuits (e.g., diodes) integrated between groups of solar cell system 100 connectors and configured to enable current to flow around shaded groups of solar cell systems 100 in the flexible solar panel 200.

7.2.2 Clamshell Interface

In another implementation shown in FIG. 6, the first cap 202 includes a clamshell structure: configured to enclose the first end of the solar cell system 100; and defining a parting plane between the two halves of the clamshell structure that intersects the electrical pins of the glass housing 102 when the cap is installed on the first end of the glass housing 102. Thus, each half of the clamshell structure can include recesses for the electrical pins at the parting plane. Accordingly, the clamshell structure can be assembled over the first end of the glass housing 102—with the electrical pins located in and/or supported by the recesses in the clamshell halves—and then fastened together to clamp the clamshell structure over the first end of the glass housing 102 with the electrical pins passing into (or through) the recesses in the clamshell structure. As shown, the second cap 204 can define a similar or identical geometry and can be similarly coupled to the second end of the glass housing 102.

For example, the first cap 202 can include a fork: defining a semicircle base of internal radius similar to the external radius of the first cable 212; and is symmetric across a horizontal plane through the longitudinal axis of the glass housing 102. A U-clamp with similar semicircle base of internal radius similar to the radius of the first cable 212 is configured to fasten over the fork with a set of threaded fasteners and to thus clamp the first cable 212 between the semicircle bases of the U-clamp and the fork. Therefore, the first end of the solar cell system 100 can be coupled to and retained at a particular location on the first cable 212 by installing and clamping the first cable 212 between the U-clamp and the fork on the first cap 202 of the solar cell system 100. The second end of the solar cell system 100 can be similarly coupled to and retained at a particular location on the second cable 214 by similarly clamping the second cable 214 between a U-clamp and a fork on the second cap 204 of the solar cell system 100.

Additional solar cell systems 100 can be similarly installed on the first and second cables 212, 214 at a target pitch between adjacent solar cell systems 100. Furthermore, in this implementation, an individual solar cell system 100 can be removed from the flexible solar panel 200—such as for replacement or maintenance—by unfastening the U-clamps from each end of the solar cell system 100. Additional solar cell systems 100 can be similarly installed between the first and second cables 212, 214, such as to decrease the open area of the flexible solar panel 200 and/or to increase the power output of the flexible solar panel 200.

7.2.3 Loop Interfaces

In yet another implementation shown in FIG. 7, the first cap 202 defines a hook (e.g., a "split" or partial loop) extending outwardly from the first cap 202 opposite the first end of the glass housing 102 and reversing downwardly across a horizontal plane through the longitudinal axis of the solar cell system 100. In this implementation, the first cap 202 can also include: a hinged, spring-loaded gate extending from the outer face of the cap 202 to latch against a free end (or "nose") of the hook; and/or a locking sleeve (e.g., a spring-loaded linear sleeve or a threaded sleeve) arranged over the gate and configured to lock the gate against the free end of the hook.

In this implementation, the first and second cables 212, 214 can be manufactured with fiducials or ferrules crimped onto the cables 212, 214 or wound into the cables 212, 214 at the target pitch distance. A set of solar cell systems 100 can then be installed on the first and second cables by: clipping the hooks extending from the first caps 202 on the first ends of these solar cell systems 100 onto, adjacent, or between fiducials on the first cable 212; and then clipping hooks extending from the second caps 204 on second ends of these solar cell systems 100 onto, adjacent, or between fiducials on the second cable 214.

In this example implementation, an individual solar cell system 100 can be removed from the flexible solar panel 200—such as for replacement or maintenance—by unhooking the hooks at each end of the solar cell system 100 from their corresponding cables 212, 214. Similarly, in this implementation, additional solar cell systems 100 can be installed in a flexible solar panel 200 by clipping these hooks on the ends of these additional solar cell systems 100 onto the first and second cables 212, 214 between existing solar cell systems 100 in the flexible solar panel 200.

Alternatively, one or both of the partial loops shown in FIG. 7 can be replaced with a full and continuous loop. For example, one or both of the first and second caps 202, 204 can each include: a continuous loop extending outwardly opposite the first end of the glass housing 102 and symmetric across horizontal and vertical planes passing through the longitudinal axis of the housing and configured to receive the cable 212, 214; and an elastic grommet arranged within the loop and configured to insulate the loop from the cable 212, 214. In this example implementation, the flexible solar panel 100 can be assembled by: passing the first cable 212 through these loops in first caps 202 on first ends of the set of solar cell systems 100; passing a second cable 214 through loops in second caps 204 on second ends of the set of solar cell systems 100; and installing fiducials along the first and second cables 212, 214 between the respective solar cell systems 100.

For example, U-bolt cable clips can be installed on the first and second cables 212, 214 on each side of each cap 202, 204 to locate these solar cell systems 100 at a target pitch along the length of the flexible solar panel 200. Alternatively, the set of solar cell systems 100 can be: installed on the first cable 212 with two loose ferrules between each adjacent first cap 202 on the solar cell systems 100; and similarly installed on the second cable 214 with two loose ferrules between each adjacent second cap 204 on the solar cell systems 100. Two ferrules on each side of each first cap 202 can then be crimped onto the first cable 212 to locate the first ends of these solar cell systems 100 at the target pitch distance along the first cable 212; and pairs of ferrules on the second cable 214 can be similarly crimped to locate the second ends of these solar cell systems 100 at the target pitch distance along the second cable 214.

7.2.4 Adjustable Interface

In the foregoing implementation, the first cap 202 can also be split into: an inner segment defining the solar cell system 100 bore and pin bores and mounted to the first end of the solar cell system 100; and an outer segment defining the cable interface and pivotably coupled to the inner segment. The second cap 204 can similarly include inner and outer segments. In this example implementation, a fastener or clamp arranged between the inner and outer segments of the first and second caps 202, 204 can be loosened, and the inner segments of these caps—and the solar cell system 100 coupled thereto—can be rotated (e.g., "rolled") relative to the outer cap segments and the cables 212, 214, thereby enabling roll adjustment of the angular position of the solar cell system 100 on the cables even after the flexible solar panel 100 is deployed and installed, such as to track the orientation of the cable 212, 214 to an altitude of the Sun once the flexible solar panel 100 is deployed.

7.2.5 Integrated Mechanical Connector

In one variation, the first cable bore 234 is fabricated directly into the structure of the glass housing 102 proximal the first end of the glass housing 102, such as by heating the glass housing 102 to a glass transition temperature and then crimping and piercing the glass housing 102 to form a sealed glass structure around this first cable bore 234. In this variation, the upper and lower pins of the glass housing 102 can extend up to and through the first end of the glass housing 102 and can pass over and below the first cable bore, respectively. A second cable bore can be similarly manufactured near the second end of the glass housing 102. The first and second cables 212, 214 can thus be installed directly in these integrated cable bores or these solar cell systems 100.

In this variation, additional external supporting structure can also be installed on or about solar cell system 100 around the first and second cable bores. For example, a composite (e.g., fiberglass, Kevlar) can be wrapped and bonded around the first and second ends of the glass housing 102 in order to distribute the weight of the solar cell system 100 across regions of the solar cell system 100 near the cable bores and thus reduce local stresses on the glass housing 102. In this example implementation, the electrical harness can be installed directly over the electrical pins extending from the first end of the solar cell system 100, such as described above.

8. Deployments

As shown in FIGS. 8A, 8B, 8C, and 8D, the flexible solar panel 200 can be deployed and installed in various settings and incorporate various additional structures and functions, including for example battery storage capacity, electric vehicle charging, and local grid power generation.

8.1 Agricultural

Figure 8A:
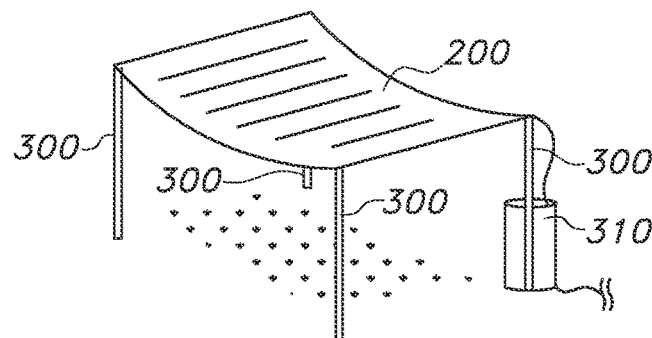
FIG. 8A is a schematic representation of an example deployment of the first solar panel system.

As shown in FIG. 8A, the flexible solar panel 200 can be placed over an agricultural field in order to: shade these crops and increase crop yield; and output electrical power directly to a local electric grid or to power electric agricultural vehicles via a battery and/or charging station 310.

Generally, the open area of each flexible solar panel 200—and therefore the solar shading and energy absorption by the flexible solar panel 200—is a function of pitch spacing of solar cell systems 100 in the flexible solar panel 200. Therefore, for deployment over an agricultural field, the flexible solar panel 200 can be configured according to a pitch spacing: proportional to light demand of the crop grown on the agricultural field; inversely proportional to heat and light sensitivity of this crop; and/or inversely proportional to historical or forecast temperatures and solar light intensity in the geographic region of the agricultural field.

To install a set of flexible solar panels 200 over an agricultural field, an array of support members 300 is first installed between crop rows across the agricultural field with the lateral pitch between these posts equal to the width of the flexible solar panel 200 and with the longitudinal pitch between these posts equal to the length of the flexible solar panel 200 when suspended from both ends (e.g., a "droop length" of the flexible solar panel 200 when forming a catenary curve between support members 300). For example, for a 200-foot-long agricultural field with four-foot crop row spacing, a set of flexible solar panels 200 approximately 8 feet in width (i.e., spanning two crop rows) and 50 feet in length can be deployed to this agricultural field. At a specified tension, each flexible solar panel 200 can be designed to span a 40-foot length. Therefore, a column of five flexible solar panels 200 may be assembled to span the full length of the agricultural field. Accordingly, the panel of posts can be installed on the agricultural field at 8-foot lateral pitch offset and 40-foot longitudinal pitch offset.

Additionally or alternatively, a set of flexible solar panels 200 can be deployed across or between a set of support members 300 including truss support members buttressing the support members 300 and bearing some of the load from the flexible support panels 200. In this alternative implementation, the truss members can function to increase the rigidity and resilience of the structure while decreasing the number of support members 300 needed to support the set of flexible solar panels 200.

Subsequently, a coiled flexible solar panel 200 is located on a spool on the back of a truck, flatbed, or pushcart. The flexible solar panel 200 coil is driven to a first end of the agricultural field, a first guy line looped over a first support member 300 in the post panel, and a second guy line looped over a second support member 300 in the post panel. The first end of the first cable 212 is then hooked to the first guy line, the second end of the second cable 214 is hooked to the second guy line, and the first and second guy lines are tensioned to pull the first ends of the first and second cables 212, 214 up to the tops of the first and second support members 300. The first ends of the first and second cables are thus fastened to the first and second support members 300.

The flexible solar panel 200 is then driven to the next pair of support members 300 installed at the agricultural field as the flexible solar panel 200 uncoils onto the ground. With the flexible solar panel 200 near the third and fourth support members 300 and fully uncoiled, the first guy line is looped over the top of the third support member 300 in the post panel and connected to the second end of the first cable 212; and the second guy line is looped over the top of the fourth support member in the post panel and connected to the second end of the second cable 214. The first and second guy lines are then tensioned to pull the second ends of the first and second cables 212, 214 up to the tops of the third and fourth support members 300, and the second ends of the first and second cables are then fastened to the third and fourth support members 300.

This process can then be repeated to install additional flexible solar panels 200 across the remaining support members 300 in the agricultural field.

These installed flexible solar panels 200 are then grounded, and the electrical harnesses of the flexible solar panels 200 are interconnected and connected to a power sink 310 to complete the flexible solar panel 200 installation.

In a similar implementation, support member 300 piers can be located at post locations throughout the agricultural field at the lateral and longitudinal pitch distances described above with the base of each support member 300 pinned to its pier and laid horizontally in the agricultural field.

The first ends of the first and second cables 212, 214 of a first flexible solar panel 200 are then connected to the tops of the first and second support members 300; the first flexible solar panel 200 is then uncoiled onto the agricultural field with its second end drawn near a next pair of support members 300; and the second ends of the first and second cables 212, 214 of the first flexible solar panel 200 are connected to the tops of these third and fourth support members 300.

This process is repeated to connect additional flexible solar panels 200 to their corresponding posts with these posts and flexible solar panels 200 resting on the agricultural field.

Once these flexible solar panels 200 are assembled onto their corresponding support members 300, the last support member 300 pair in a first column of support members 300 is tensioned and raised into a vertical orientation, thereby lifting the last flexible solar panel 200 in this column over the agricultural field, raising the next set of support members 300 into the vertical orientation, and lifting the next flexible solar panel 200 in this column over the agricultural field.

Bracing (e.g., tension cables or beams to resist compression) can then be installed between the support members 300 and/or from these support members 300 to the ground in order to buttress the support members 300 and the flexible solar panel 200 installation.

The flexible solar panels 200 can then be grounded, and the electrical harness may be installed between these flexible solar panels 200 and connect a power sink 310 to complete the flexible solar panel 200 installation.

The installed flexible solar panels 200 can output electricity, such as to power other agricultural operations or farm equipment (e.g., electric agricultural vehicles) or to augment electrical grid power. These installed flexible solar panels 200 can also partially shade a crop below, such as in lower latitudes, in order to: slow an evaporation rate after irrigation and thus reduce total irrigation volume; and reduce ground surface temperatures, thereby reducing need to cool the crop via irrigation and reducing total water consumption across the agricultural field.

By setting the pitch spacing between solar cell systems 100 in these flexible solar panels 200 according to the light demand of the crop below and according to local solar radiation conditions, etc., these installed flexible solar panels 200 can produce no or minimal reduction in crop yield at the agricultural field (and may instead increase crop yield) while reducing water consumption and augmenting energy access at the agricultural field.

8.2. Vertical Installation

Figure 8B:
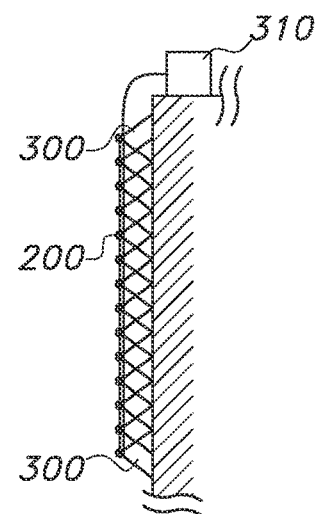
FIG. 8B is a schematic representation of an example deployment of the first solar panel system.

In another variation shown in FIG. 8B, a flexible solar panel 200 is configured to install onto a sloping or vertical surface using a pair of horizontally oriented support members 300 or rigid struts. In one implementation, the flexible solar panel 200 is paired with a set of struts 300, each defining a series of solar cell system 100 cups offset at a pitch distance—along its length—equal to a pitch spacing between the solar cell system 100 in the flexible solar panel 200. In this implementation, each cup defines a concave (e.g., semicircular) receptacle configured to receive and retain a solar cell system 100 cup; and each strut 300 can also define a channel extending along its length, intersecting these cups, and configured to receive a cable extending between solar cell systems 100 in the flexible solar panel 200. Furthermore, each strut 300 can define a length approximating the length of a flexible solar panel 200, or multiple struts 300 can be assembled into the length of the flexible solar panel 200.

The struts 300 can be installed on a horizontal or sloping surface, such as a pitched roof or flat roof deck, to rigidly constrain the solar cell systems 100 in the flexible solar panel 200; and the flexible solar panel 200 can be quickly deployed in this installation by uncoiling the flexible solar panel 200 and dropping each solar cell system 100 into a corresponding pair of cups defined by the struts. Alternatively, as shown in FIG. 8B, the struts 300 can be installed on a vertical surface, such as an exterior wall, to rigidly constrain the solar cell system 100 in the flexible solar panel 200 against (and offset from) the vertical surface.

Conversely, for a low-profile flexible installation on a flat, sloped, or vertical surface, such as a roof or wall of a building: a panel of short, triangulated support structures 300 can be mounted to the target surface at lateral and longitudinal pitch offsets described above; the flexible solar panel 200 can be strung between the triangulated support structures 300. Generally, a set of triangulated support structures 300 can be arranged at the ends of the flexible support panel 200. In variations of the example implementation, a second set of triangular support structures 300 can be disposed at one or more locations along the length of the flexible solar panel 200 to provide additional support and resilience to the flexible solar panel 200.

8.3. Parking Lot

Figure 8C:
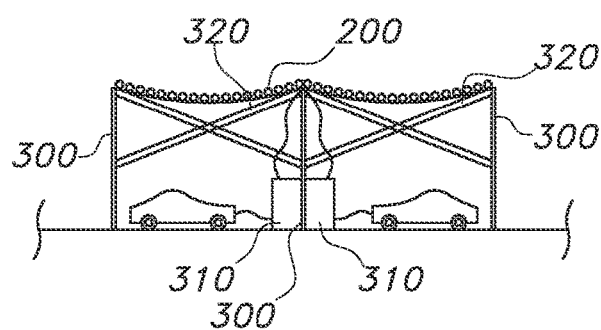
FIG. 8C is a schematic representation of an example deployment of the first solar panel system.

As shown in FIG. 8C, a set of flexible solar panels 200 can also be deployed and installed over a parking lot in order to: shade vehicles and pedestrians occupying the parking lot; and output electrical power to a local grid, battery, or electric vehicle charging station 310.

In one implementation, a set of support members 300 are installed along a division between two abutting rows of parking spaces and along opposing ends of the parking lot to form a panel of support members: laterally offset by a pitch distance equal to a width of the flexible solar panels 200; and longitudinally offset by a suspended length of the flexible solar panels 200, as described above. Processes described above may then be implemented to string the flexible solar panels 200 between each cluster of four support members and over the parking lot.

Additionally or alternatively, a set of flexible solar panels 200 can be deployed across or between a set of support members 300 including truss support members buttressing the support members 300 and bearing some of the load from the flexible support panels 200. In this alternative implementation, the truss members can function to increase the rigidity and resilience of the structure while decreasing the number of support members 300 needed to support the set of flexible solar panels 200.

In this implementation, a translucent cover 320—such as a white nylon or canvas awning (or "shade cloth")—can also be installed between these posts and under the flexible solar panels 200. The translucent cover can function to: shield vehicles and pedestrians below from rain and the majority of sunlight and reflect incident solar radiation back up to the rear sides of bifacial solar cells 120 for increased energy capture; without necessitating additional ground connections or framework below the flexible solar panel 200 installation.

8.4. Deployment: On Water

Figure 8D:
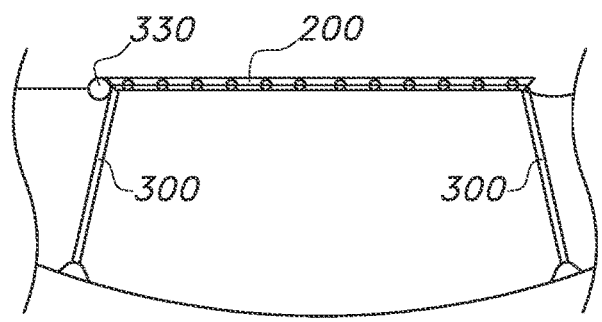
FIG. 8D is a schematic representation of an example deployment of the first solar panel system.

In another variation shown in FIG. 8D, the flexible solar panel 200 is configured to deploy onto a body of water. In this variation, the electrical harness can include water-proof female plug connectors configured to seal around the electrical pins of solar cell systems 100 in the flexible solar panel 200. Once assembled, the flexible solar panel 200 can be unrolled directly from the drum or spool on which it is shipped onto the surface of a body of water, such as a lake or ocean. The ends of the first and second cables 212, 214 in the flexible solar panel 100 can also be anchored to support members 300, such as to a set of buoys, piers, sunken anchors, moors, mooring ropes, or to a dock.

As noted above, in one variation of the solar cell system 100, the glass housings 102 are pivotably coupled to their corresponding caps 202, 204. In this variation, a secondary cable or row of rigid struts can be coupled to: the first caps of the solar cell systems 100 below (or above) the first cable 212; and to an actuator 330 nearby, as shown in FIG. 8D. In this variation, the flexible solar panel 200 can also include a secondary cable or row of rigid struts coupled to the second caps 204 of the solar cell systems 100 and/or to the actuator 330. In use, the actuator 330 can selectively tension and release the secondary cables or rigid struts in order to pivot (i.e., "roll") the solar cell systems 100 over the body of water, such as to track the tops of the solar cell systems 100 to the Sun.

In a similar implementation, an upper cable or row of rigid struts can be coupled to the first caps of the solar cell systems 100 above the first cable; a lower cable or row of rigid struts can be coupled to the first caps of the solar cell systems 100 below the first cable; and the actuator can selectively tension and release the upper and lower cables or rigid struts in order to pivot the solar cell systems 100 and thus track the tops of the solar cell systems 100 to the Sun.

Furthermore, in this variation, each solar cell system 100 can include a set of solar cells running along its lower section, (e.g., on a second side of the first diameter). In this variation, each solar cell system can also include a solar concentrator running along the top of its internal bore and configured to concentrate incident light on the solar cell below. Thus, in this implementation, the solar cells in these solar cell systems 100 can be cooled by the surrounding water on which the flexible solar panel 200 floats; and the actuator 330 can drive the solar cell systems 100 over a range of roll positions in order to track the solar concentrator to the altitude of the Sun over time.

The flexible solar panel 100 configured for land-based deployment as described above can similarly include secondary upper and/or lower cables configured to roll the projection systems relative to the cables in order to track the solar cell systems 100 to the Sun.

As a person skilled in the art will recognize from the previous detailed description and from the figures and claims, modifications and changes can be made to the embodiments of the invention without departing from the scope of this invention as defined in the following claims.

I claim:
1. A solar cell system comprising:
 a glass housing defining a first end, a second end opposite the first end, a circular cross-section defining a first diameter and a second diameter perpendicular to the first diameter;
 a set of rows of bifacial perovskite solar cells comprising:
  a first row of bifacial perovskite solar cells:
   arranged within a first volume of the glass housing defined on a first side of the first diameter and on a first side of the second diameter,
   defining a first front side facing outwardly from a center of the glass housing; and
   defining a first rear side facing inwardly toward the center of the glass housing; and
  a second row of bifacial perovskite solar cells:
   arranged within a second volume of the glass housing defined on the first side of the first diameter and on a second side of the second diameter;
   defining a second front side facing outwardly from the center of the glass housing; and
   defining a second rear side facing inwardly toward the center of the glass housing; and
 a reflective element:
  disposed on an interior surface of the glass housing on a second side of the first diameter; and reflecting incident light toward the first rear side of the first row of bifacial perovskite solar cells and toward the second rear side of the second row of bifacial perovskite solar cells;
a first terminal coupled to the set of rows of bifacial perovskite solar cells traversing through the first end of the glass housing, and sealed against the first end of the glass housing;
a second terminal coupled to the set of rows of bifacial perovskite solar cells, traversing through the second end of the glass housing, and sealed against the second end of the glass housing; and
a perovskite-compatible gaseous atmosphere sealed within the glass housing.

2. A solar cell system comprising:
a glass housing defining a cross-section defining a first diameter and a second diameter perpendicular to the first diameter, a first end, and a second end opposite the first end, the glass housing comprising:
    a tubular volume; and
    a reflective element disposed in the glass housing;
a set of rows of solar cells arranged along the tubular volume within the glass housing and each defining a front side and a rear side facing the reflective element, wherein the set of rows of solar cells comprises a first row of solar cells and a second row of solar cells positionally offset from the first row of solar cells across the cross-section of the glass housing, the set of rows of solar cells arranged on a first side of the first diameter of the cross-section and the reflective element disposed on a second side of the first diameter of the cross-section;
a first terminal coupled to a first end of the set of rows of solar cells, traversing through and sealed against the first end of the glass housing; and
a ballast arranged within the glass housing and positionally offset opposite the set of rows of solar cells across the cross-section of the glass housing to bias an orientation of the solar cell system to capture incident solar energy.

3. The solar cell system of claim 2, further comprising a second terminal coupled to a second end of the set of rows of solar cells, traversing through, and sealed against, the second end of the glass housing.

4. The solar cell system of claim 2, wherein the first row of solar cells comprises a row of perovskite solar cells arranged on the first side of the first diameter and arranged on a first side of the second diameter.

5. The solar cell system of claim 4, wherein the second row of solar cells comprises a row of perovskite solar cells arranged on the first side of the first diameter and arranged on a second side of the second diameter.

6. The solar cell system of claim 5, wherein the reflective element comprises a coating disposed on an interior surface of the glass housing on a second side of the first diameter opposite the first side of the first diameter and facing the rear side of the set of rows of solar cells such that a portion of light incident on the reflective element is reflected toward the rear side of the set of rows of solar cells.

7. The solar cell system of claim 5, further wherein the reflective element comprises a specular reflector defining a first and parabolic cross-section and a second parabolic cross-section, each of the first and second parabolic cross-sections coplanar with the circular cross-section and each of the first and second parabolic cross-sections arranged to reflect a portion of the light incident upon the reflective element toward the rear side of the set of rows of solar cells.

8. The solar cell system of claim 5, wherein the reflective element comprises a diffuse reflector to reflect a portion of the light incident upon the reflective element toward the rear side of the set of rows of solar cells.

9. The solar cell system of claim 2, wherein the first row of solar cells comprises:
    a crystalline silicon layer disposed adjacent the perovskite layer; and
    a perovskite layer configured to pass a portion of light, incident on the first row of solar, to the crystalline silicon layer.

10. The solar cell system of claim 2:
    wherein the cross-section defines an elliptical cross-section defining a major axis and a minor axis; and
    wherein the set of perovskite solar cells are arranged on a first side of the major axis.

* * * * *